(12) United States Patent
Muraki

(10) Patent No.: US 6,657,210 B1
(45) Date of Patent: *Dec. 2, 2003

(54) ELECTRON BEAM EXPOSURE METHOD, A METHOD OF CONSTRUCTING EXPOSURE CONTROL DATA, AND A COMPUTER-READABLE MEDIUM

(75) Inventor: Masato Muraki, Inagi (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,654

(22) Filed: Jun. 22, 1999

(30) Foreign Application Priority Data

Jun. 24, 1998 (JP) .......................... 10-177142

(51) Int. Cl.⁷ .......................... H01J 37/302; H01J 37/00
(52) U.S. Cl. .............. 250/492.22; 250/491.1; 250/492.1; 250/492.21; 250/492.3
(58) Field of Search .............. 250/396 R, 492.21, 250/492.1, 492.22, 491.1

(56) References Cited

U.S. PATENT DOCUMENTS

| | | | |
|---|---|---|---|
| 4,199,689 A | * 4/1980 | Takigawa | 250/492 A |
| 4,213,053 A | * 7/1980 | Pfeiffer | 250/492 A |
| 4,943,729 A | * 7/1990 | Ando et al. | 250/492.3 |
| 5,051,598 A | * 9/1991 | Ashton et al. | 250/492.2 |
| 5,260,579 A | * 11/1993 | Yasuda et al. | 250/492.2 |
| 5,864,142 A | 1/1999 | Muraki et al. | |
| 5,905,267 A | 5/1999 | Muraki | |

FOREIGN PATENT DOCUMENTS

JP 10-64812 3/1998

* cited by examiner

*Primary Examiner*—John R. Lee
*Assistant Examiner*—David A. Vanore
(74) *Attorney, Agent, or Firm*—Fitzpatrick, Cella, Harper & Scinto

(57) ABSTRACT

An electron beam exposure method is provided to draw partial patterns on a plurality of element exposure regions, two-dimensionally aligned on a wafer, with a plurality of electron beams, thereby drawing one pattern on the wafer. This method includes the determination step and the drawing step. In the determination step, an electron beam irradiation amount of one irradiation cycle for each element exposure region is determined by considering a pattern to be drawn on a predetermined region including the element exposure region. In the drawing step, the partial patterns are drawn on the element exposure regions on the wafer with the electron beams while controlling an irradiation amount of each electron beam in accordance with the electron beam irradiation amount of one irradiation cycle determined for each of the element exposure regions in the determination step, thereby drawing one pattern on the wafer.

27 Claims, 15 Drawing Sheets

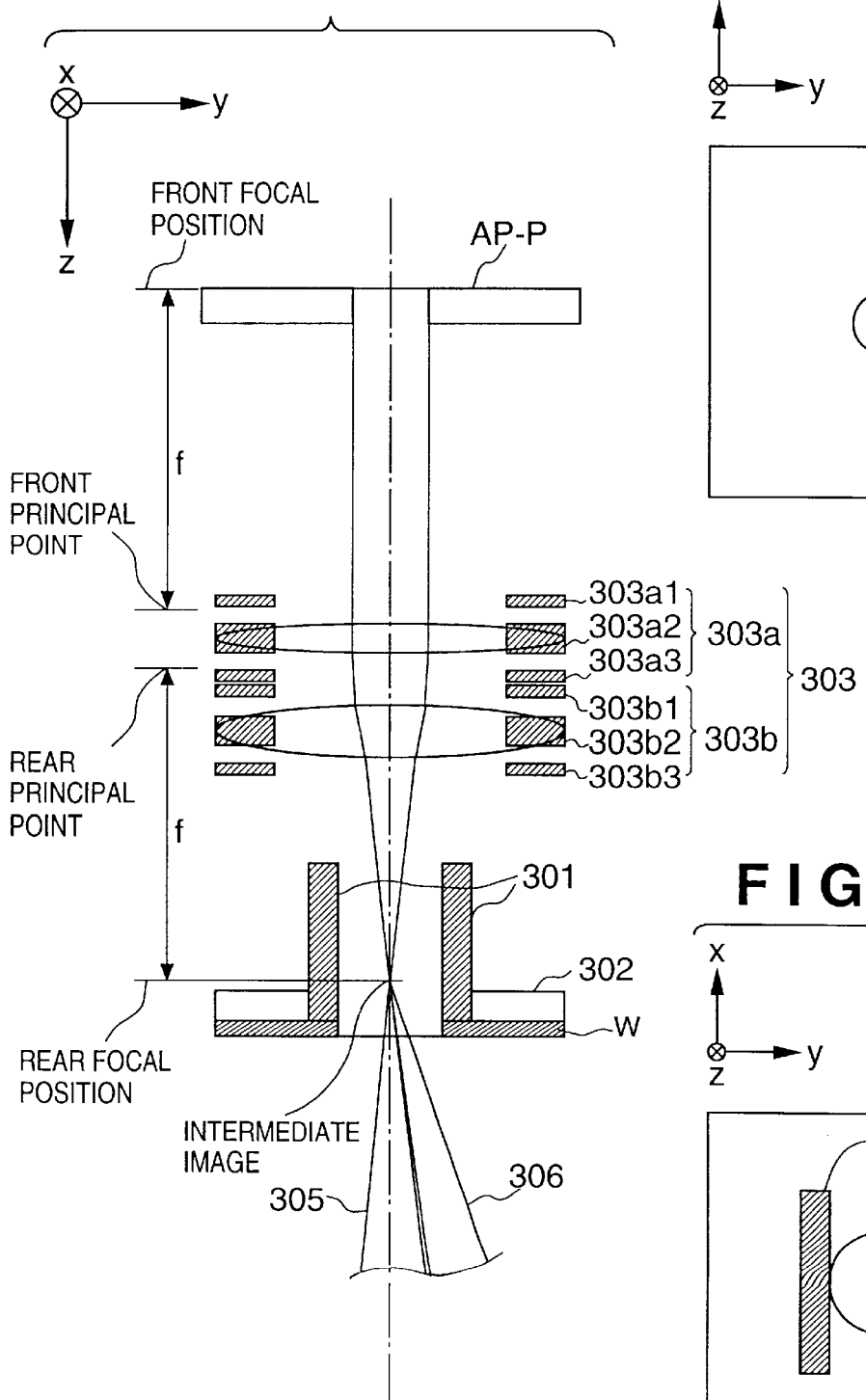
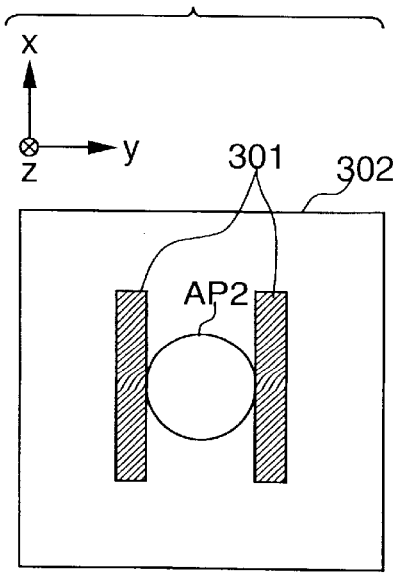

FIG. 8

[CONTENTS OF EXPOSURE CONTROL DATA]

| MAIN FIELD No. | EXPOSURE CONTROL DATA | | | |
|---|---|---|---|---|
| 1 | SFD (1) | SFD (2) | ... | SFD (16) |
| 2 | SFD (1) | SFD (2) | ... | SFD (16) |

[CONTENTS OF EXPOSURE CONTROL DATA SFD IN UNITS OF SUBFIELDS]

| SUBFIELD No. | REFERENCE POSITION | EXPOSURE CONTROL DATA IN UNITS OF ELEMENT EXPOSURE REGIONS (ELEMENT ELECTRON OPTICAL SYSTEMS) | | | |
|---|---|---|---|---|---|
| SFD (1) | x(1), y(1) | EFD (1,1) | EFD (1,2) | ... | EFD (64,64) |
| SFD (2) | x(2), y(2) | EFD (1,1) | EFD (1,2) | ... | EFD (64,64) |

[CONTENTS OF EXPOSURE CONTROL DATA EFD IN UNITS OF ELEMENT EXPOSURE REGIONS (ELEMENT ELECTRON OPTICAL SYSTEMS)]

| ELEMENT EXPOSURE REGION | IRRADIATION TIME | ARRAY POSITION | BLANKING CONTROL |
|---|---|---|---|
| EFD (n, n) | t (n) | x (1), y (1) | on or off |
| | | ... | ... |
| | | x (k), y (k) | on or off |

FLOW OF MANUFACTURE OF SEMICONDUCTOR DEVICE

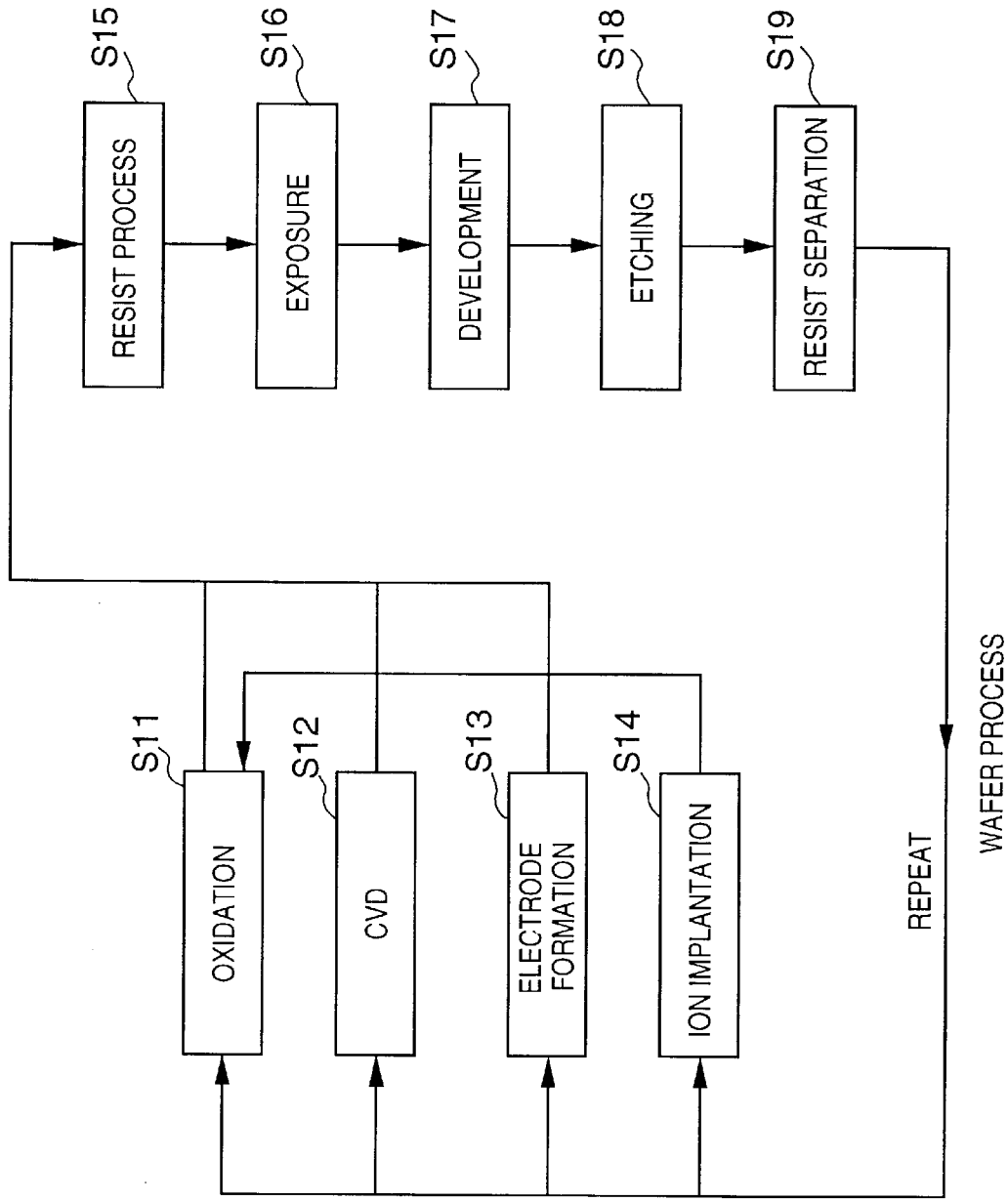

ELECTRON BEAM EXPOSURE METHOD, A METHOD OF CONSTRUCTING EXPOSURE CONTROL DATA, AND A COMPUTER-READABLE MEDIUM

BACKGROUND OF THE INVENTION

1. Field of the Invention

The present invention relates to an electron beam exposure method and apparatus and an exposure control data construction method and, more particularly, to an electron beam exposure method and apparatus for drawing partial patterns on a plurality of element exposure regions, arranged two-dimensionally on a substrate, with a plurality of electron beams, thereby drawing one pattern on the substrate, and a method of constructing exposure control data necessary for controlling this apparatus.

For example, the method and apparatus according to the present invention can be suitably used for drawing a pattern on a substrate such as a silicon wafer or glass substrate, or for drawing a pattern on a material for forming a mask or reticle in order to form the mask or reticle.

2. Description of the Related Art

FIG. 15A shows the outline of a conventional multi electron beam exposure apparatus. Reference numerals 501a, 501b, and 501c denote electron guns; 502, a reduction electron optical system; and 504, a deflector. The electron guns 501a, 501b, and 501c can turn on/off electron beams separately. The reduction electron optical system 502 reduces a plurality of electron beams emitted by the electron guns 501a, 501b, and 501c and projects the reduced electron beams onto a wafer 503. The deflector 504 deflects the plurality of reduced, projected electron beams onto the wafer 503.

The plurality of electron beams emitted by the electron guns 501a, 501b, and 501c are deflected by the deflector 504 with the same deflection amount. The respective electron beams are thus deflected, with reference to their beam reference positions, while their positions on the wafer are sequentially settled in accordance with the arrangement having array gaps determined by the minimum deflection width of the deflector 504. The respective electron beams expose different element exposure regions with patterns to be exposed.

FIGS. 15A, 15B, and 15C show how the electron beams from the electron guns 501a, 501b, and 501c expose patterns, that should be exposed, onto corresponding element exposure regions (EF1, EF2, and EF3) in accordance with the same arrangement. The respective electron beams move while their positions are settled such that their positions on the respective arrays at the same time point become (1,1), (1,2), . . . , (1,16), (2,1), (2,2), . . . , (2,16), (3,1), . . . The electron beams actually irradiate the wafer 503 at positions where the patterns (P1, P2, and P3) to be exposed exist, thereby exposing the respective element exposure regions with the patterns to be exposed.

When drawing a pattern with the electron beam exposure apparatus, electrons incoming to the wafer are reflected and scattered by the wafer (backscattering). The scattered electrons photosensitize portions of a resist applied to the wafer excluding incident points. This is a phenomenon called a proximity effect. Due to the proximity effect, the resist pattern after development has a shape and size different from the desired shape and size.

In a variable shaping type electron beam exposure apparatus, a pattern to be drawn is divided into a plurality of regions in order to reduce the proximity effect, and the irradiation amount is adjusted in units of regions.

In the conventional multi electron beam exposure apparatus, the irradiation time is fixed so that all of the plurality of electron beams have the same irradiation amounts at the irradiation positions. Therefore, data necessary for controlling irradiation of the respective electron beams is sufficient if it is 1-bit data representing whether to irradiate the electron beam. When, however, the irradiation amounts of the electron beams are adjusted in units of appropriate regions in order to reduce the proximity effect, in the multi electron beam exposure apparatus, the electron beam irradiation time must be adjusted in units of irradiation positions of the respective electron beams. For example, as data necessary for controlling irradiation time having 128 gradation levels, 7-bit data are added to the control data of each irradiation cycle of the electron beams, thus multiplying the exposure control data by 8. In other words, when reducing the proximity effect, in the multi electron beam exposure apparatus, the data amount increases very much.

SUMMARY OF THE INVENTION

The present invention has been made in view of the above situation, and has as its object to determine the electron beam irradiation amount of one irradiation cycle in units of element exposure regions, thereby decreasing the amount of data necessary for controlling exposure operation.

According to the first aspect of the present invention, there is provided an electron beam exposure method of drawing partial patterns on a plurality of element exposure regions, two-dimensionally aligned on a substrate, with a plurality of electron beams, thereby drawing one pattern on the substrate, comprising the determination step of determining an electron beam irradiation amount of one irradiation cycle for each element exposure region by considering a pattern to be drawn on a predetermined region including the element exposure region, and the drawing step of drawing the partial patterns on the element exposure regions on the substrate with the electron beams while controlling an irradiation amount of each electron beam in accordance with the electron beam irradiation amount of one irradiation cycle determined for each of the element exposure regions in the determination step, thereby drawing one pattern on the substrate.

In the electron beam exposure method according to the first aspect of the present invention, the element exposure regions are preferably aligned with an array pitch not more than a backscattering diameter of the electron beams.

In the electron beam exposure method according to the first aspect of the present invention, the electron beams are preferably aligned on the substrate with a gap not more than a backscattering diameter of the electron beams.

In the electron beam exposure method according to the first aspect of the present invention, the determination step preferably comprises determining the electron beam irradiation amount of one irradiation cycle for each element exposure region by considering a count with which the electron beam irradiate the predetermined region including the element exposure region.

In the electron beam exposure method according to the first aspect of the present invention, the determination step preferably comprises determining the electron beam irradiation amount of one irradiation cycle for each element exposure region by considering an area density of the pattern to be drawn within the predetermined region including the element exposure region.

In the electron beam exposure method according to the first aspect of the present invention, the determination step preferably comprises determining the electron beam irradiation amount of one irradiation cycle for each element exposure region by considering a barycentric position of the pattern to be drawn within the predetermined region including the element exposure region.

In the electron beam exposure method according to the first aspect of the present invention, the determination step preferably comprises determining the electron beam irradiation amount of one irradiation cycle for each element exposure region by considering a position to be irradiated with the electron beam within the predetermined region including the element exposure region.

In the electron beam exposure method according to the first aspect of the present invention, the method preferably further comprises the acquisition step of acquiring the pattern to be drawn on the substrate, and the division step of dividing the pattern acquired in the acquisition step into units of element exposure regions, and the determination step preferably comprises determining the electron beam irradiation amount of one irradiation cycle for each element exposure region on the basis of the pattern divided in the division step.

According to the second aspect of the present invention, there is provided a method of constructing exposure control data for controlling a process of drawing one pattern on a substrate by drawing partial patterns on a plurality of element exposure regions, two-dimensionally aligned on the substrate, with a plurality of electron beams, comprising the acquisition step of acquiring the pattern to be drawn onto the substrate, the division step of dividing the pattern acquired in the acquisition step into units of element exposure regions, the determination step of determining an electron beam irradiation amount of one irradiation cycle for each element exposure region by considering the pattern to be drawn on a predetermined region including the element exposure region, and the construction step of constructing the exposure control data on the basis of a determination result of the determination step and recording the exposure control data on a memory medium.

According to the third aspect of the present invention, there is provided a computer-readable program, for constructing exposure control data for controlling a process of drawing one pattern on a substrate by drawing partial patterns on a plurality of element exposure regions, two-dimensionally aligned on the substrate, with a plurality of electron beams, comprising the acquisition step of acquiring the pattern to be drawn onto the substrate, the division step of dividing the pattern acquired in the acquisition step into units of element exposure regions, the determination step of determining an electron beam irradiation amount of one irradiation cycle for each element exposure region by considering the pattern to be drawn on a predetermined region including the element exposure region, and the construction step of constructing the exposure control data on the basis of a determination result of the determination step and recording the exposure control data on a memory medium.

According to the fourth aspect of the present invention, there is provided an electron beam exposure apparatus for drawing partial patterns on a plurality of element exposure regions, two-dimensionally aligned on a substrate, with a plurality of electron beams, thereby drawing one pattern on the substrate, comprising determination means for determining an electron beam irradiation amount of one irradiation cycle for each element exposure region by considering a pattern to be drawn on a predetermined region including the element exposure region, and drawing means for drawing the partial patterns on the element exposure regions on the substrate with the electron beams while controlling an irradiation amount of each electron beam in accordance with the electron beam irradiation amount of one irradiation cycle determined for each of the element exposure regions by the determination means, thereby drawing one pattern on the substrate.

Further objects, features and advantages of the present invention will become apparent from the following detailed description of an embodiment of the present invention with reference to the accompanying drawings.

BRIEF DESCRIPTION OF THE DRAWINGS

FIGS. 3A to 3C are views for explaining an element electron optical system;

FIG. 8 explains exposure control data;

FIG. 14 is a flow chart for explaining a wafer process; and

DETAILED DESCRIPTION OF THE PREFERRED EMBODIMENT

<Description of Constituent Elements of Multi Electron Beam Exposure Apparatus>

Figure 1:
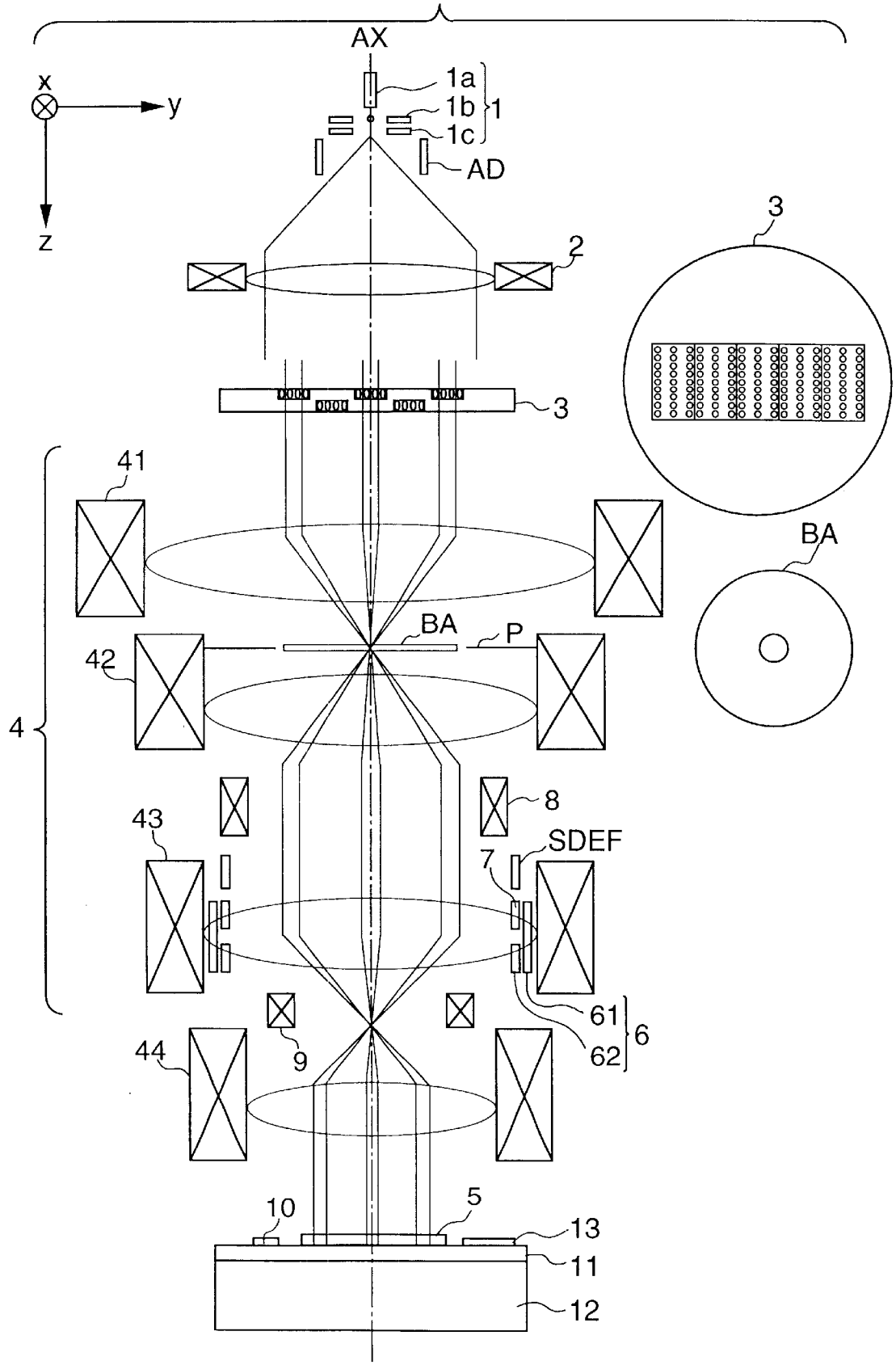
FIG. 1 is a view schematically showing the main part of a multi electron beam exposure apparatus according to the present invention.

FIG. 1 schematically shows the main part of a multi electron beam exposure apparatus according to the present invention. Referring to FIG. 1, reference numeral 1 denotes an electron gun consisting of a cathode 1a, a grid 1b, and an anode 1c. Electrons irradiated by the cathode 1a form a crossover image between the grid 1b and anode 1c (this crossover image will be referred to as an electron source hereinafter).

Electrons irradiated by this electron source form a substantially parallel electron beam through an illumination electron optical system 2, the front focal position of which is located at the electron source position. The substantially parallel electron beam from the illumination electron optical system 2 comes incident on an element electron optical system array 3. The element electron optical system array 3 is formed by arranging a plurality of element electron optical systems, each consisting of an aperture, an electron optical system, and a blanking electrode disposed two-dimensionally and perpendicular to an optical axis AX. The element electron optical system array 3 will be described in detail later.

The element electron optical system array 3 forms a plurality of intermediate images of the electron source. The respective intermediate images are reduced and projected onto a wafer 5 by a reduction electron optical system 4 (to be described later), to form electron source images having substantially the same size on the wafer 5. The array pitch of the plurality of electron beams on the wafer is set to be equal to the backscattering diameter (10 µm or less when the acceleration voltage of the electron beams is 50 kV) of the electron beams on the wafer 5 or less. In this embodiment, the array pitch is set to 3.6 µm.

The focal lengths and the like of the respective element electron optical systems are set such that the sizes of the electron source images on the wafer 5 become substantially the same. Furthermore, in the element electron optical system array 3, the position of each intermediate image in the direction of the optical axis AX is adjusted so as to adjust the curvature of field of the reduction electron optical system 4. The element electron optical system array 3 also corrects, in advance, an aberration that occurs when each intermediate image is reduced and projected onto the wafer 5 by the reduction electron optical system 4.

The reduction electron optical system 4 is constituted by a symmetric magnetic tablet consisting of a first projection lens 41 (43) and a second projection lens 42 (44). The distance between the two lenses 41 and 42 is f1+f2 where f1 is the focal length of the first projection lens 41 (43) and f2 is the focal length of the second projection lens 42 (44). The object point on the axis AX is at the focal position of the first projection lens 41 (43), and the image point on the axis AX is formed on the focal point of the second projection lens 42 (44). This image is reduced to −f2/f1. The two lens magnetic fields are determined to act in the opposite directions. Hence, theoretically, Seidel aberrations other than five aberrations, i.e., spherical aberration, isotropic astigmatism, isotropic coma, curvature of field, and on-axis chromatic aberration, and chromatic aberrations concerning rotation and magnification are cancelled.

Reference numeral 6 denotes a drawing deflector. The drawing deflector 6 deflects the plurality of electron beams from the element electron optical system array 3 to deflect a plurality of electron source images on the wafer 5 by substantially the same deflection widths in the X and Y directions. The drawing deflector 6 is constituted by a main deflector 61 and a subdeflector 62. The main deflector 61 has a wide deflection width but requires a long time to settle, i.e., a long settling wait time. The subdeflector 62 has a narrow deflection width but requires a short settling wait time. The main deflector 61 is an electromagnetic deflector, while the subdeflector 62 is an electrostatic deflector. Reference symbol SDEF denotes a stage following deflector for causing the plurality of electron beams from the element electron optical system array 3 to follow continuous movement of an X-Y stage 12. The stage following deflector SDEF is an electrostatic deflector. A dynamic focus coil 7 corrects the focal position shift of an electron source image formed by the deflection aberration that occurs when the drawing deflector 6 is actuated. A dynamic stigmatic coil 8 corrects astigmatism of deflection errors caused by deflection, in the same manner as the dynamic focus coil 7. When the number of the plurality of electron beams irradiate the wafer or the sum of currents flowing to the wafer increases, electron beam blurring occurs due to the Coulomb effect. In order to correct this, a refocus coil 9 adjusts the focal position of the reduction electron optical system 4. A Faraday cup 10 has two single knife edges extending in the X and Y directions. The Faraday cup 10 detects the amount of charges of the electron source images formed by the electron beams from the element electron optical systems. A θ-Z stage 11 has a wafer on it and can move in the direction of optical axis AX (Z axis) and can rotate about the Z axis. An X-Y stage 12 has the θ-Z stage 11 on it and can move in an X-Y direction perpendicular to the optical axis AX (Z axis).

Figure 2:
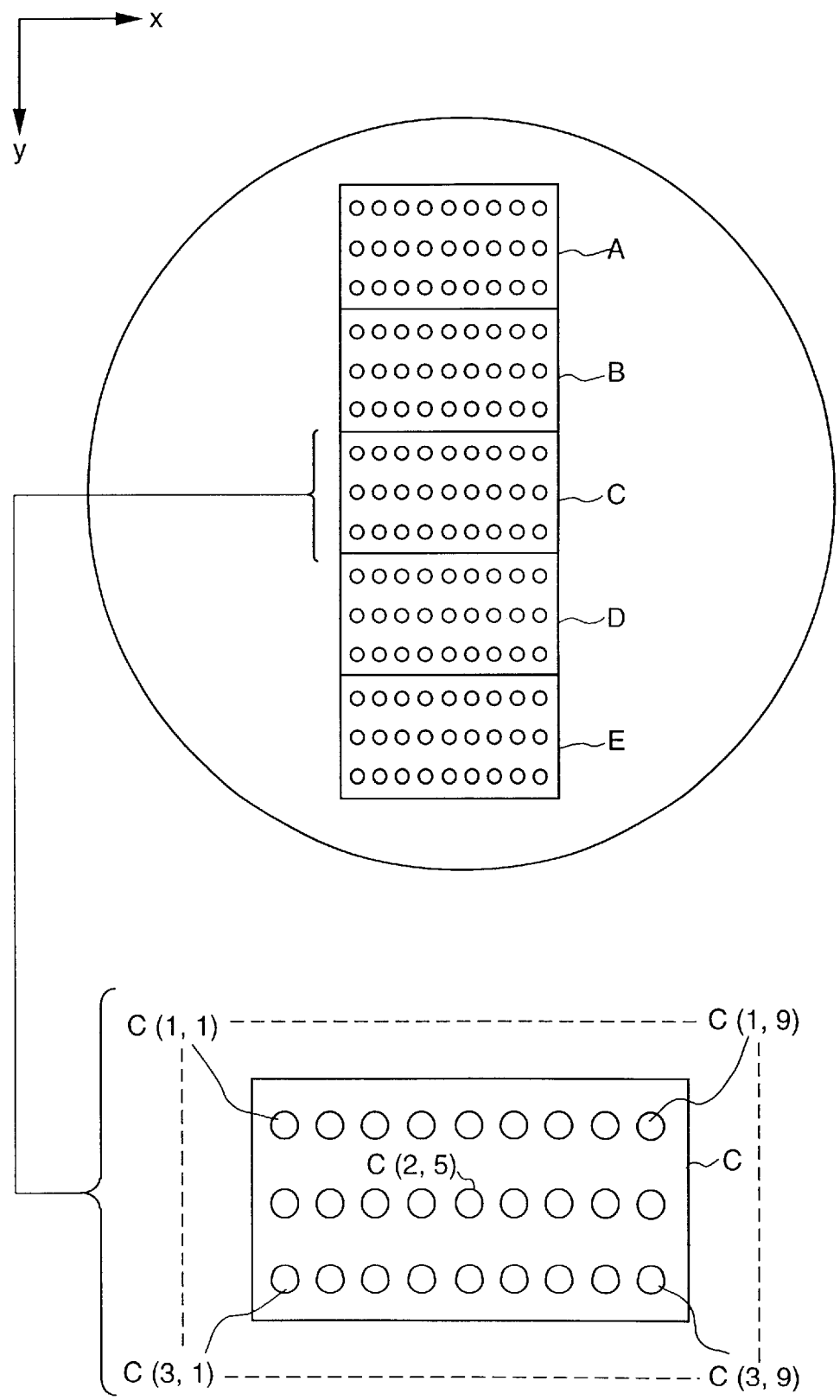
FIG. 2 explains an element electron optical system array 3.

The element electron optical system array 3 will be described. The element electron optical system array 3 groups (into subarrays) a plurality of element electron optical systems, and a plurality of subarrays are formed on it. For example, as shown in FIG. 2, five subarrays A to E are formed. A plurality of element electron optical systems are two-dimensionally arranged on each subarray. In each subarray of this embodiment, 27 element electron optical systems, e.g., C(1,1) to C(3,9), are formed.

FIG. 3A is a sectional view of each element electron optical system. Referring to FIG. 3A, reference symbol AP-P denotes a substrate to be illuminated with the electron beam, which is made substantially parallel by the illumination electron optical system 2, and having an aperture (AP1) defining the spot shape of the electron beam transmitted through it. The substrate AP-P is common in other element electron optical systems. In other words, the substrate AP-P is a substrate having a plurality of apertures. FIG. 3B is a plan view of the substrate AP-P.

A blanking electrode 301 is constituted by a pair of electrodes and has a deflecting function. A substrate 302 is a substrate having an aperture (AP2) and is common in other element electron optical systems. The blanking electrode 301 and a wiring (W) for turning on/off the electrodes are formed on the substrate 302. In other words, the substrate 302 is a substrate having a plurality of apertures and a plurality of blanking electrodes. FIG. 3C is a plan view of the substrate 302.

An electron optical system 303 is constituted by three aperture electrodes and uses two unipotential lenses 303a and 303b having a converging function of setting the upper and lower electrodes at the same potential as an accelerating potential V0 and maintaining the intermediate electrode at a different potential V1 or V2. The respective aperture electrodes are stacked on a substrate through an insulator. This substrate is common in other element electron optical systems. In other words, this substrate is a substrate having a plurality of electron optical systems 303.

Figure 4A:
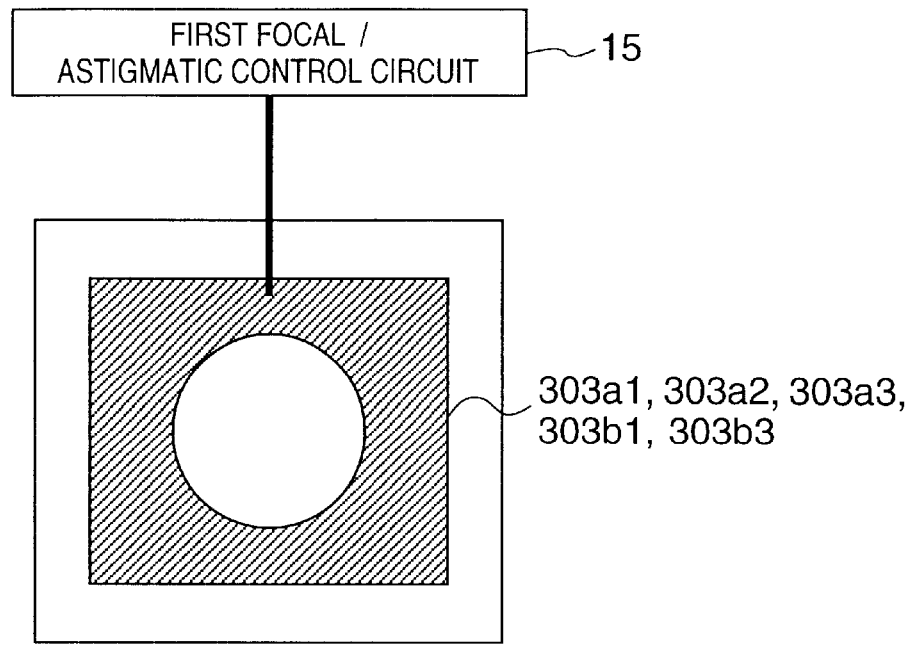
FIGS. 4A and 4B are views for explaining the electrodes of the element electron optical system.

The upper, intermediate, and lower electrodes 303a1, 303a2, and 303a3 of the unipotential lens 303a and the upper and lower electrodes 303b1 and 303b2 of the unipotential lens 303b have a shape as shown in FIG. 4A. The upper and lower electrodes 303a1 and 303a3, and 303b1 and 303b3 of the unipotential lenses 303a and 303b are set by a first focal/astigmatic control circuit 15 (to be described later) at a potential common in all the element electron optical systems.

Since the potential of the intermediate electrode 303a2 of the unipotential lens 303a can be set by the first focal/astigmatic control circuit 15 in units of element electron optical systems, the focal length of the unipotential lens 303a can be set in units of element electron optical systems.

Figure 4B:
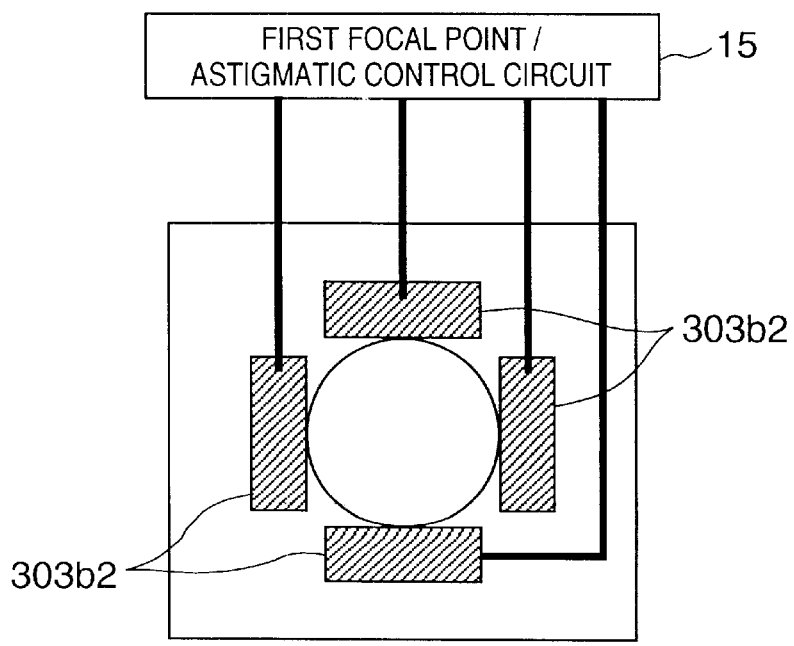

The intermediate electrode 303b2 of the unipotential lens 303b is constituted by four electrodes as shown in FIG. 4B. The potentials of the four electrodes can be separately set by the first focal/astigmatic control circuit 15, and in units of element electron optical systems as well. Accordingly, the focal lengths of the unipotential lens 303b can be made different on the perpendicular sections of the unipotential lens 303b, and can be separately set in units of element electron optical systems.

As a result, the electron optical characteristics (intermediate image formation position and astigmatism) of the element electron optical systems can be controlled by controlling the intermediate electrodes of the electron optical system 303. When controlling the intermediate image formation position, the size of the intermediate image is determined by the ratio of the focal length of the illumination electron optical system 2 to that of the electron optical system 303, as described above. Therefore, the intermediate image formation position is moved by setting constant the focal lengths of the electron optical system 303 and moving the positions of the principal points of the electron optical system 303. As a result, the intermediate images formed by all the element electron optical systems can have substantially the same size while setting them at different positions in the axial direction.

The electron beam which is made substantially parallel by the illumination electron optical system 2 forms an intermediate image of the electron source through the aperture (AP1) and electron optical system 303. At or near the front focal position of the electron optical system 303, the corresponding aperture (AP1) is located. At or near the intermediate image formation position of the electron optical system 303 (the rear focal position of the electron optical system 303), the corresponding blanking electrode 301 is located. As a result, unless an electric field is applied across the electrodes of the blanking electrode 301, the electron beam is not deflected like an electron beam 305. When an electric field is applied across the electrodes of the blanking electrode 301, the electron beam is deflected like an electron beam 306. The electron beams 305 and 306 have angular distributions that are different from each other on the object plane of the reduction electron optical system 4. At the pupil position (on a plane P in FIG. 1) of the reduction electron optical system 4, the electron beams 305 and 406 accordingly are incident on regions different from each other. For this reason, a blanking aperture BA for transmitting only the electron beam 305 through it is formed at the pupil position (on the plane P of FIG. 1) of the reduction electron optical system 4.

When the intermediate images formed by the electron lenses of the respective element electron optical systems are reduced and projected onto an exposure target surface by the reduction electron optical system 4, curvature of field and astigmatism occur. In order to correct these, the potentials of the two intermediate electrodes of each electron optical system 303 are set separately, so that the electron optical characteristics (the intermediate image formation position, and astigmatism) of the respective element electron optical systems are different. Note that in this embodiment, the element electron optical systems in the same subarray have the same electron optical characteristics in order to reduce the number of wirings between the intermediate electrodes and the first focal/astigmatic control circuit 15, and the electron optical characteristics (the intermediate image formation position, and astigmatism) of the respective element electron optical systems are controlled in units of subarrays.

When a plurality of intermediate images are reduced and projected onto the exposure target surface by the reduction electron optical system 4, distortion occurs. In order to correct this, the distortion characteristics of the reduction electron optical system 4 are obtained in advance, and the positions of the respective element electron optical systems in a direction perpendicular to the optical axis of the reduction electron optical system 4 are set on the basis of the obtained distortion characteristics.

Figure 5:
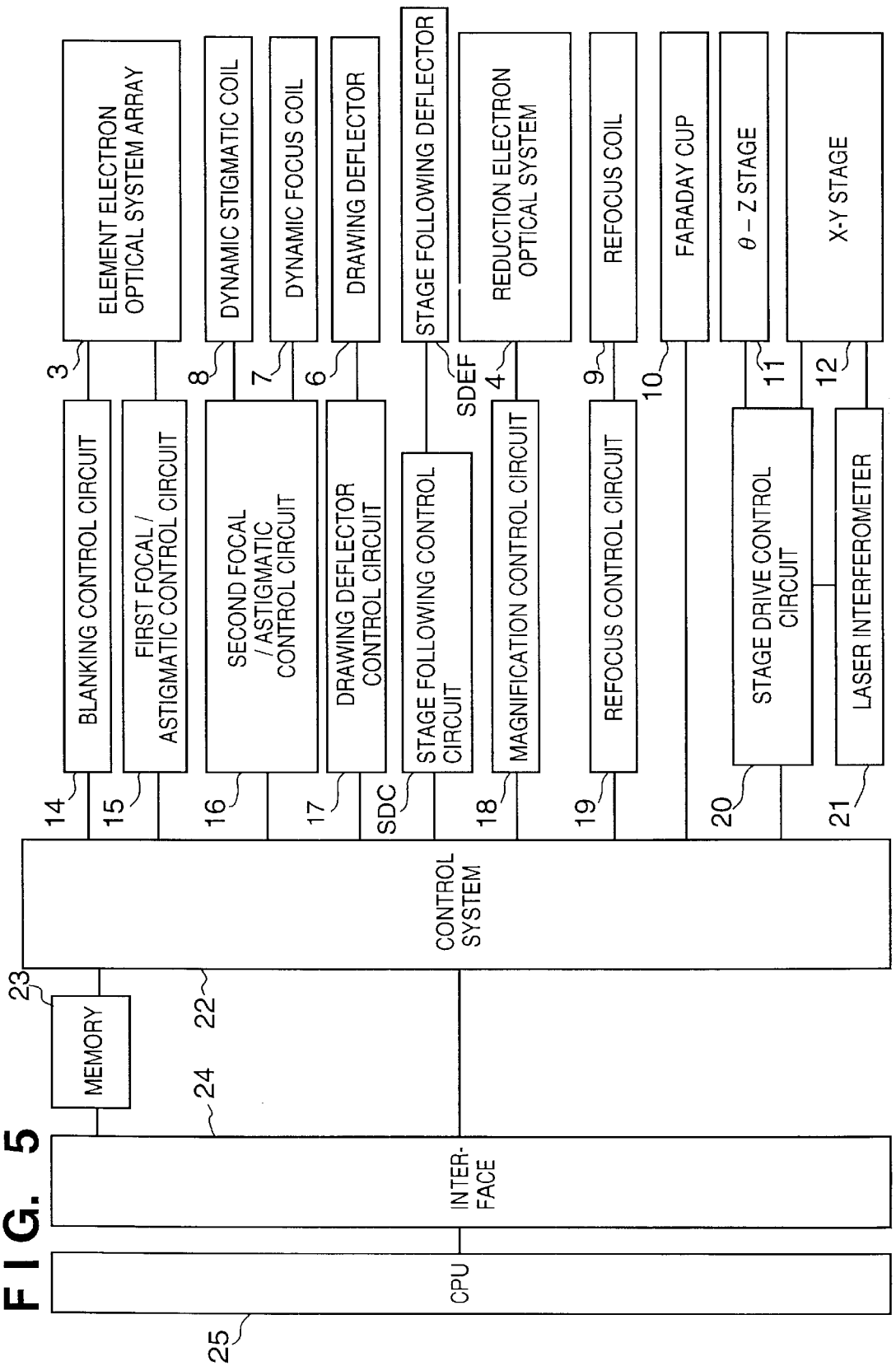
FIG. 5 is a block diagram for explaining a system configuration according to the present invention.

FIG. 5 shows the system configuration of this embodiment. A blanking control circuit 14 controls ON/OFF operation of the blanking electrodes of the respective element electron optical systems of the element electron optical system array 3 separately. The first focal/astigmatic control circuit 15 controls the electron optical characteristics (the intermediate image formation position, and astigmatism) of the respective element electron optical systems of the element electron optical system array 3 separately.

A second focal/astigmatic control circuit 16 controls the dynamic stigmatic coil 8 and dynamic focus coil 7, thereby controlling the focal position and astigmatism of the reduction electron optical system 4. A drawing deflector control circuit 17 controls the drawing deflector 6. A stage following control circuit SDC controls the stage following deflector SDEF such that the electron beam follows continuous movement of the X-Y stage 12. A magnification control circuit 18 adjusts the magnification of the reduction electron optical system 4. A refocus control circuit 19 controls a current to be supplied to the refocus coil 9, thereby adjusting the focal position of the reduction electron optical system 4.

A stage drive control circuit 20 drives and controls the θ-Z stage 11, and the X-Y stage 12 in cooperation with a laser interferometer 21 that detects the position of the X-Y stage 12.

A control system 22 controls the plurality of control circuits described above, the reflected electron detector 9, and the Faraday cup 10 in synchronism in order to perform exposure and alignment on the basis of exposure control data sent from a memory 23. The control system 22 is controlled by a CPU 25, which controls the entire electron beam exposure apparatus, through an interface 24.

<Description of Exposure Operation>

The exposure operation of the electron beam exposure apparatus of this embodiment will be described with reference to FIG. 6.

On the basis of the exposure control data from the memory 23, the control system 22 instructs the drawing deflector control circuit 17 to deflect the plurality of electron beams from the element electron optical system array 3 by the subdeflector 62 of the drawing deflector 6 with the minimum deflection width of the subdeflector 62 as a unit, and instructs the blanking control circuit 14 to turn on/off the blanking electrodes of the respective element electron optical systems in accordance with a pattern to be exposed on the wafer 5. At this time, the X-Y stage 12 continuously moves in the X direction. The control system 22 instructs the stage following control circuit SDC to deflect the plurality of electron beams by the stage following deflector SDEF so as to follow the movement of the X-Y stage 12. The electron beams from the element electron optical systems scan and expose element exposure regions (EF) on the wafer 5, as shown in FIG. 6. In this embodiment, the minimum deflection width of the subdeflector 62 is 25 nm, and Sx=Sy=3.6 μm. Therefore, 144×144 arrays are defined in the element exposure regions (EF) as positions where the electron beams are to be settled.

The plurality of element exposure regions (EF) corresponding to the plurality of element electron optical systems of the element electron optical system array 3 are two-dimensionally aligned adjacent to each other on the wafer to have no spaces among them. The array pitch of the element exposure regions (EF) on the wafer 5 is set to be equal to or smaller than the backscattering diameter of the electron beams on the wafer (when the acceleration voltage of the electron beams is 50 kV, 10 μm or less). As a result, one subfield (SF) constituted by a plurality of element exposure regions (EF) is exposed on the wafer 5 at once. In this embodiment, the plurality of element exposure regions (EF) are aligned for M=64 (elements) in the X direction and for N=64 (elements) in the Y direction. The size of each subfield (SF) is 230.4×230.4 ($\mu$m$^2$).

Figure 6:
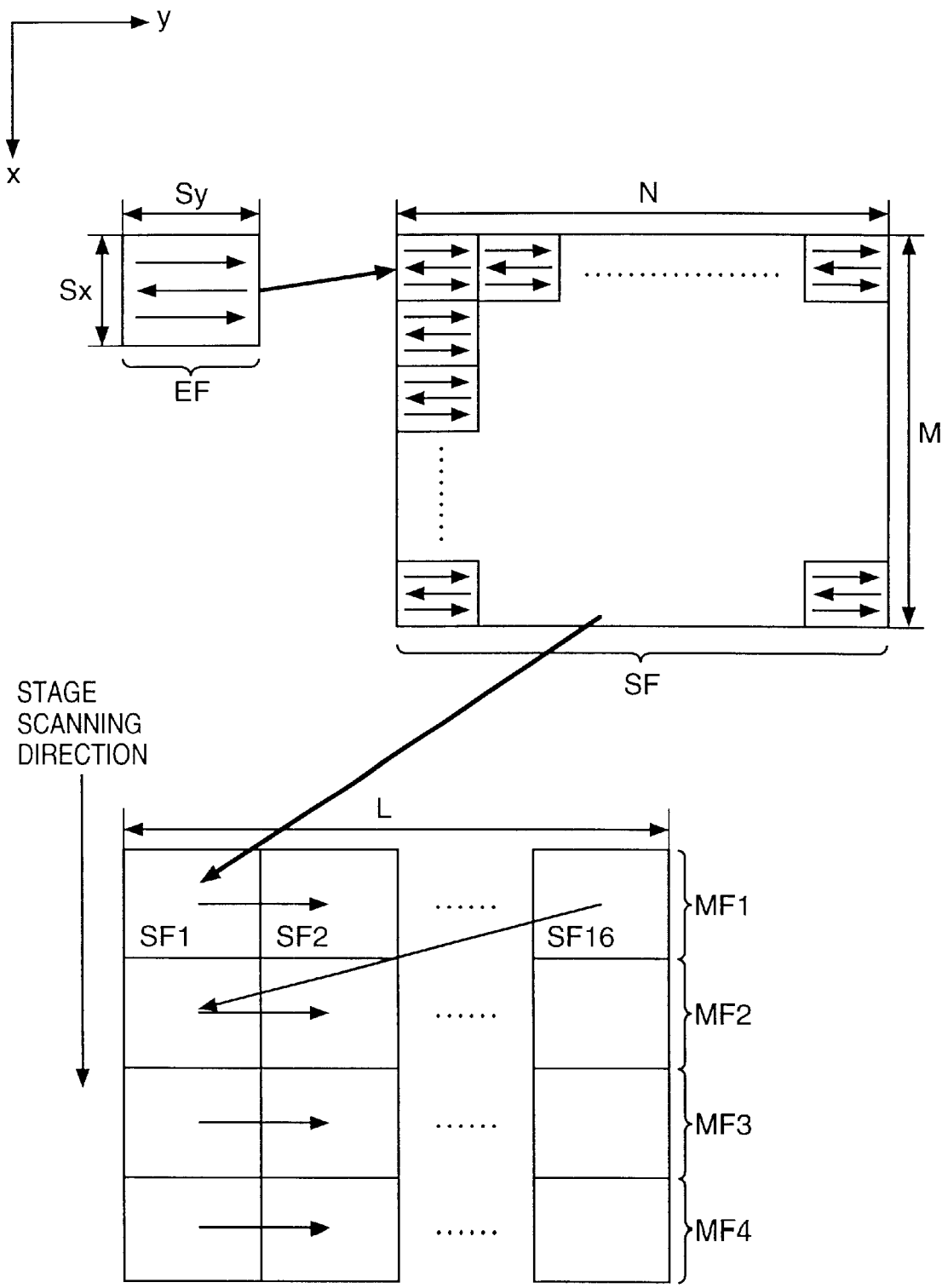
FIG. 6 is a view for explaining exposure fields (EF), subfields (SF), and main fields (MF)

After exposing a first subfield (SF1) shown in FIG. 6, in order to expose a second subfield (SF2), the control system 22 instructs the drawing deflector control circuit 17 to deflect the plurality of electron beams from the element electron optical system array 3 by the main deflector 61 of the drawing deflector 6 in a direction perpendicular to the stage scanning direction. As described above, the control system 22 then instructs the drawing deflector control circuit 17 again to deflect the plurality of electron beams from the element electron optical system array 3 by the subdeflector 62 of the drawing deflector 6, and instructs the blanking control circuit 14 to turn on/off the blanking electrodes of the respective electron optical systems in accordance with the pattern to be exposed on the wafer 5, thereby exposing the second subfield (SF2). The subfields (SF1 to SF16) are sequentially exposed as shown in FIG. 6 to expose the pattern on the wafer 5. As a result, a main field (MF) constituted by the subfields (SF1 to SF16) aligned in the direction perpendicular to the stage scanning direction is exposed on the wafer 5. The subfields are aligned for L=16 (elements) in the Y direction, and the size of the main field (MF) is 230.4×3686.4 ($\mu$m$^2$).

After exposing a main field 1 (MF1) shown in FIG. 6, the control system 22 instructs the drawing deflector control circuit 17 to sequentially deflect the plurality of electron beams from the element electron optical system array 3 on the main fields (MF2, MF3, MF4, . . . ) aligned in the stage scanning direction, thereby exposing the pattern on the wafer 5.

More specifically, according to the electron beam exposure apparatus of this embodiment, the plurality of electron beams are deflected on the wafer 5 while continuously moving the θ-Z stage 11 on which the wafer 5 is placed. Irradiation of the electron beams is controlled separately for each deflection cycle, and the patterns are drawn on the element exposure regions of the respective electron beams, thereby drawing the subfield constituted by the plurality of element exposure regions. The plurality of subfields aligned in the direction perpendicular to the continuous moving direction are sequentially drawn, thereby drawing the main field constituted by the plurality of subfields. Furthermore, the plurality of main fields aligned in the continues moving direction are sequentially drawn.

<Description of Exposure Control Data Formation Processing>

A method of forming the exposure control data of the electron beam exposure apparatus of this embodiment will be described.

Figure 7:
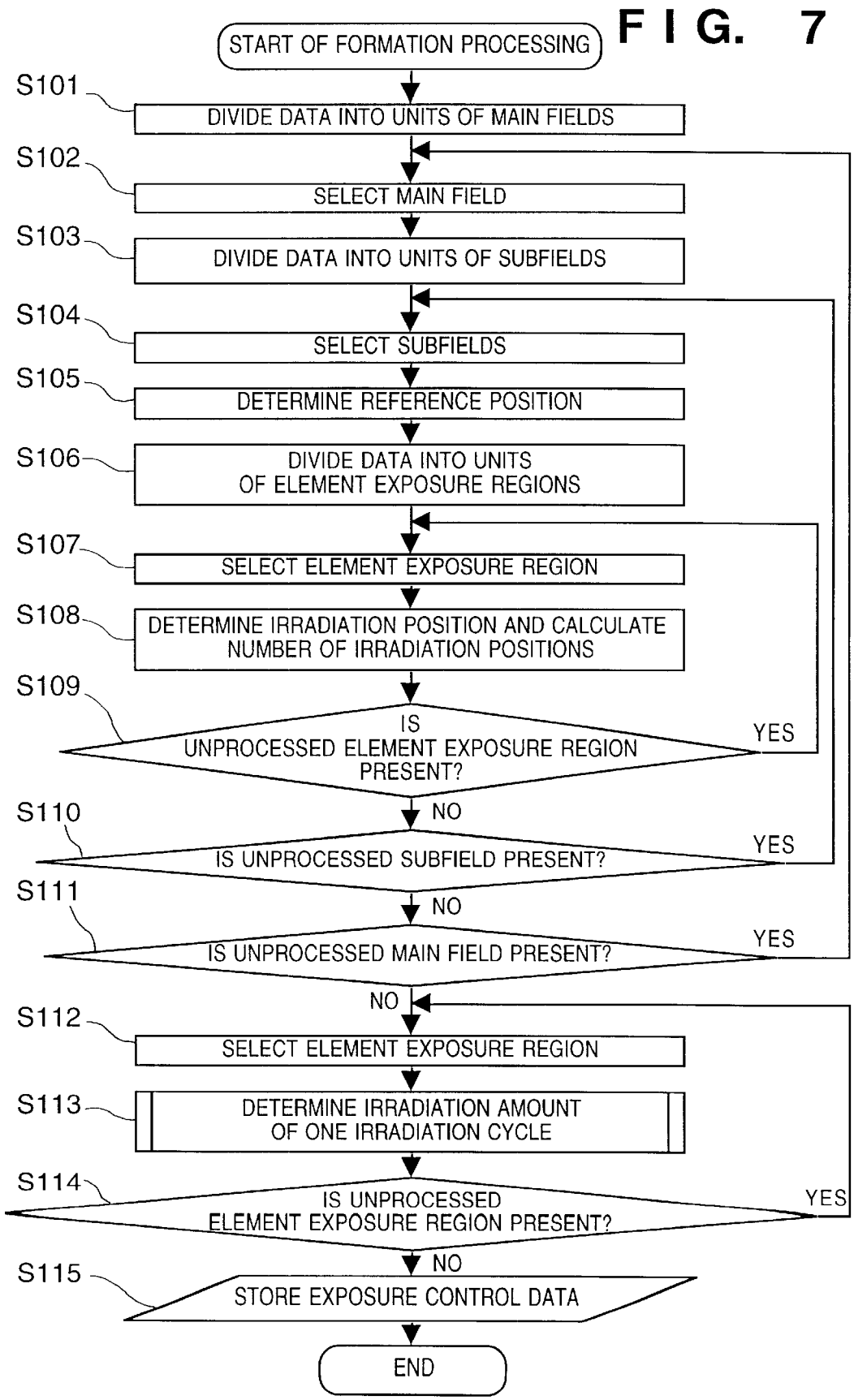
FIG. 7 is a flow chart for explaining exposure control data formation processing.

When a pattern (bitmap data) to be exposed on the wafer is input to the CPU 25, the CPU 25 performs formation processing of the exposure control data, as shown in FIG. 7. The steps of this processing will be described.

(Step S101)
The input pattern is divided into units of main fields (MF1, FM2, . . . ) described above.
(Step S102)
One main field is selected.

Figure 11:
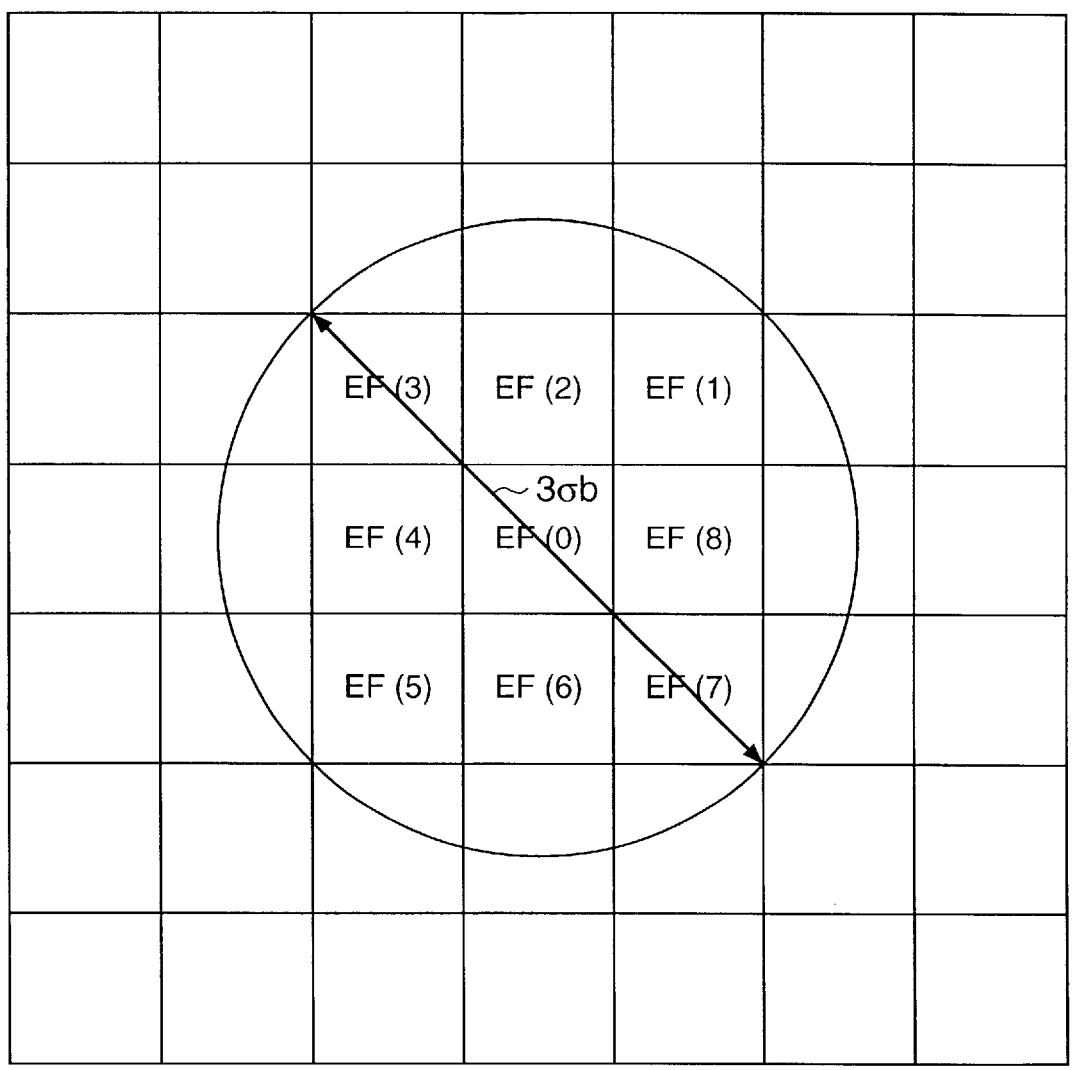
FIG. 11 is a view for explaining element exposure region selection for proximity effect correction.

(Step S103)
The pattern of the selected main field is divided into units of subfields (SF1, SF2, . . . ) described above.
(Step S104)
One subfield is selected.
(Step S105)
When exposing the selected subfield, the main deflector 61 deflects the electron beam to determine a deflection position (reference position) where the electron beam is to come incident on the wafer.
(Step S106)
The pattern of the selected subfield is divided into units of element exposure regions (EF) described above.
(Step S107)
One element exposure region is selected.
(Step S108)
The pattern of the selected element exposure region is divided with the minimum deflection width determined by the subdeflector 62 as the array gap. The array positions of the array elements to be exposed are determined, and irradiation positions (array positions where the blanking electrodes are turned on/off) to be irradiated with the electron beams are determined. Furthermore, the number of irradiation positions within the selected element exposure region (irradiation count) is calculated.
(Step S109)
If an element exposure region not processed in step S108 is present within the selected subfield, the flow returns to step S107. If not, the flow advances to step S110.
(Step S110)
If a subfield not processed in steps S105 to S109 is present within the selected main field, the flow returns to step S104. If not, the flow advances to step S111.
(Step S111)
If a main field not processed in steps S103 to S110 is present, the flow returns to step S102. If not, the flow advances to step S112.
(Step S112)
One of the element exposure regions divided by the above processing operation is selected.
(Step S113)
In order to reduce the proximity effect, the electron beam irradiation amount of one irradiation cycle in the element exposure region selected in step S112 is determined on the basis of the irradiation count (corresponding to the irradiation amount of an electron beam irradiating the element exposure region) of the plurality of element exposure regions close to the selected element exposure region. As the determining method, for example, the representative figure scheme or area density mapping scheme can be employed. These schemes will be described later in detail.
(Step S114)
If an element exposure region not processed in step S113 is present, the flow returns to step S112. If not, the flow advances to step S115.
(Step S115)
Exposure control data in units of element exposure regions as shown in FIG. 11 are stored in the memory 23, and the processing operation is ended. As the contents of the exposure control data in units of element exposure regions (element electron optical systems), data concerning the electron beam irradiation time of one irradiation cycle determined commonly in this element exposure region, and concerning ON/OFF of electron beam irradiation of the respective element electron optical systems at the array position determined by the subdeflector 62 are stored, as shown in FIG. 8.

In this embodiment, these processing operations are performed by the CPU 25 of the electron beam exposure apparatus. If these processing operations are performed by another processing unit and the corresponding exposure control data is transferred to the electron beam exposure apparatus, the object and effect of the present invention do not change.

The prior art requiring irradiation time data in units or arrays and this embodiment will be compared in the amount of data of one element exposure region (element electron optical system). Assuming that blanking control data has 1 bit (on or off), that irradiation time data has 7 bits (128 gradation levels), and that the number of array positions of the element exposure region is 20,736 (144×144), then the conventional data amount is (1+7)×20376=165888 (bits), while the data amount of this embodiment is 1×20736+7= 20743 (bits). Namely, in this embodiment, since the region employed for reducing the proximity effect coincides with the element exposure region, the proximity effect can be reduced with a data amount about ⅛ that of the prior art.

In this embodiment, the area density mapping scheme or representative figure scheme, each of which is known, is employed in order to reduce the proximity effect.

Figure 9:
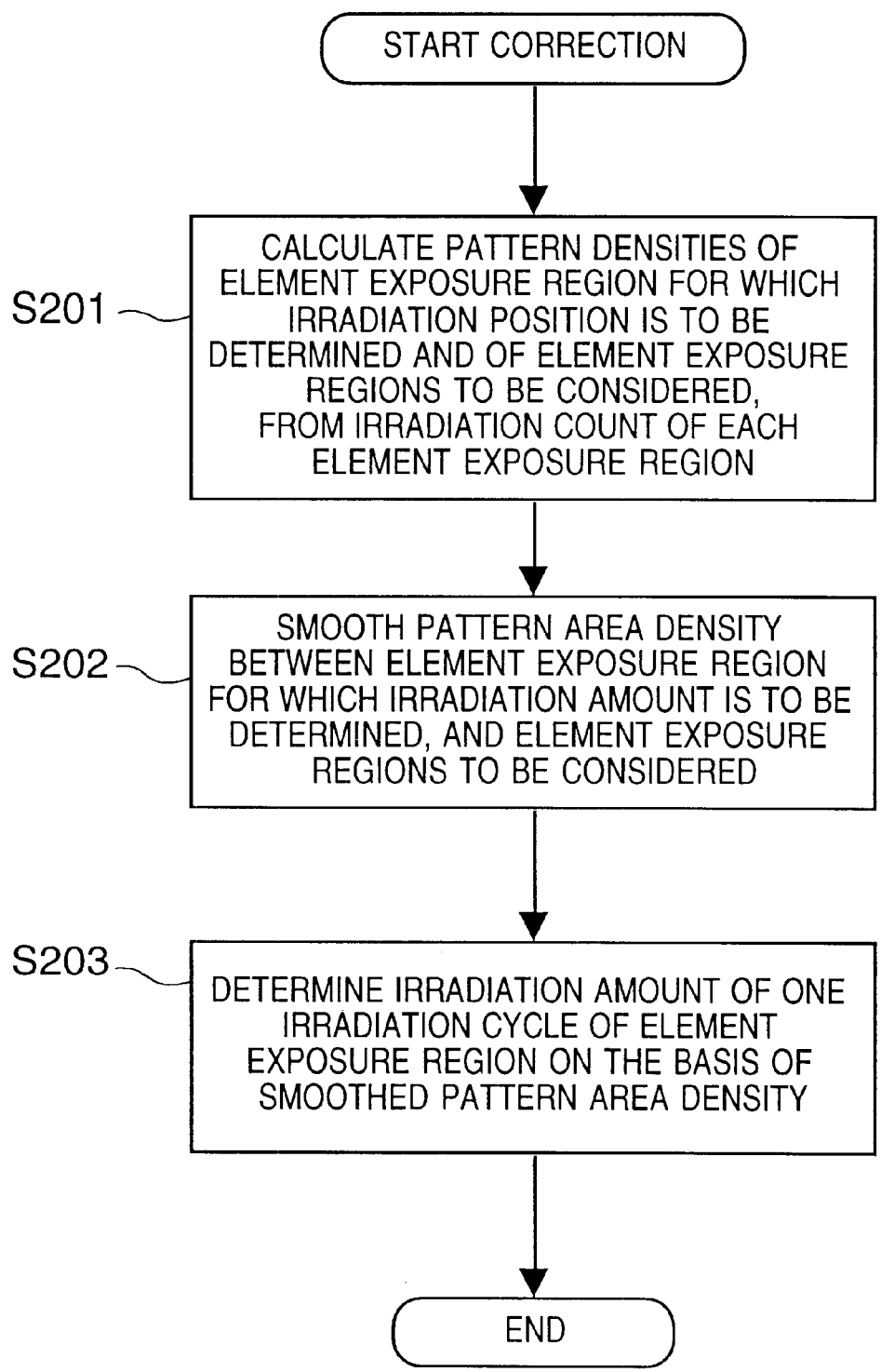
FIG. 9 is a flow chart for explaining correction processing.

An example of the determining method employing the area density mapping scheme will be described. In step S113, regarding the selected element exposure region, the CPU 25 performs a processing operation as shown in FIG. 9.

(Step S201)

FIG. 11 shows how the exposure region is divided into units of element exposure regions. An element exposure region EF(0) is the element exposure region for which the irradiation amount is to be determined. Element exposure regions about the element exposure region EF(0) as the center, the diameter of which is included in a circle having a diameter about 3 times a backscattering diameter σb of the electron beam on the wafer, are selected as the element exposure regions to be considered. More specifically, in this case, the element exposure regions (EF(1) to EF(8)) to be considered are supposed to affect the element exposure region EF(0), for which the irradiation amount is to be determined, with the proximity effect. Concerning the target for which the irradiation amount is to be determined, and the respective element exposure regions EF(0) to EF(8) to be considered, a pattern density αi of the pattern of the element exposure region EF(i) satisfying αi=Ni/Nmax (Nmax is the number of array positions in the element exposure region) is calculated from an electron beam irradiation count Ni of the element exposure region EF(i) (i=0 to 8) obtained in advance.

(Step S202)

The area density of the pattern of each element exposure region is subjected to smoothing by using the following equation:

$$\alpha av=\Sigma\alpha i/(imax+1)$$

where imax is the number (8 in this case) of element exposure regions selected in step S201 as the element exposure regions to be considered.

(Step S203)

On the basis of the smoothed pattern area density, or more comprehensively, on the basis of the pattern of a predetermined region including the element exposure region for which the irradiation amount is to be determined, an irradiation time t of one irradiation cycle (corresponding to the irradiation amount of one irradiation cycle) of the element exposure region, for which the irradiation amount is to be determined, is calculated by using the following equation:

$$t=ts\times(1+\eta)/(1+2\times\eta\times\alpha av)$$

where η is the backscattering coefficient and ts is the preset standard irradiation time of one irradiation cycle. More specifically, with this method, the preset standard irradiation time ts of one irradiation cycle, the proximity effect of which is neglected, is corrected in accordance with the above equation, thereby determining the irradiation time of one irradiation cycle of the element exposure region.

Figure 10:
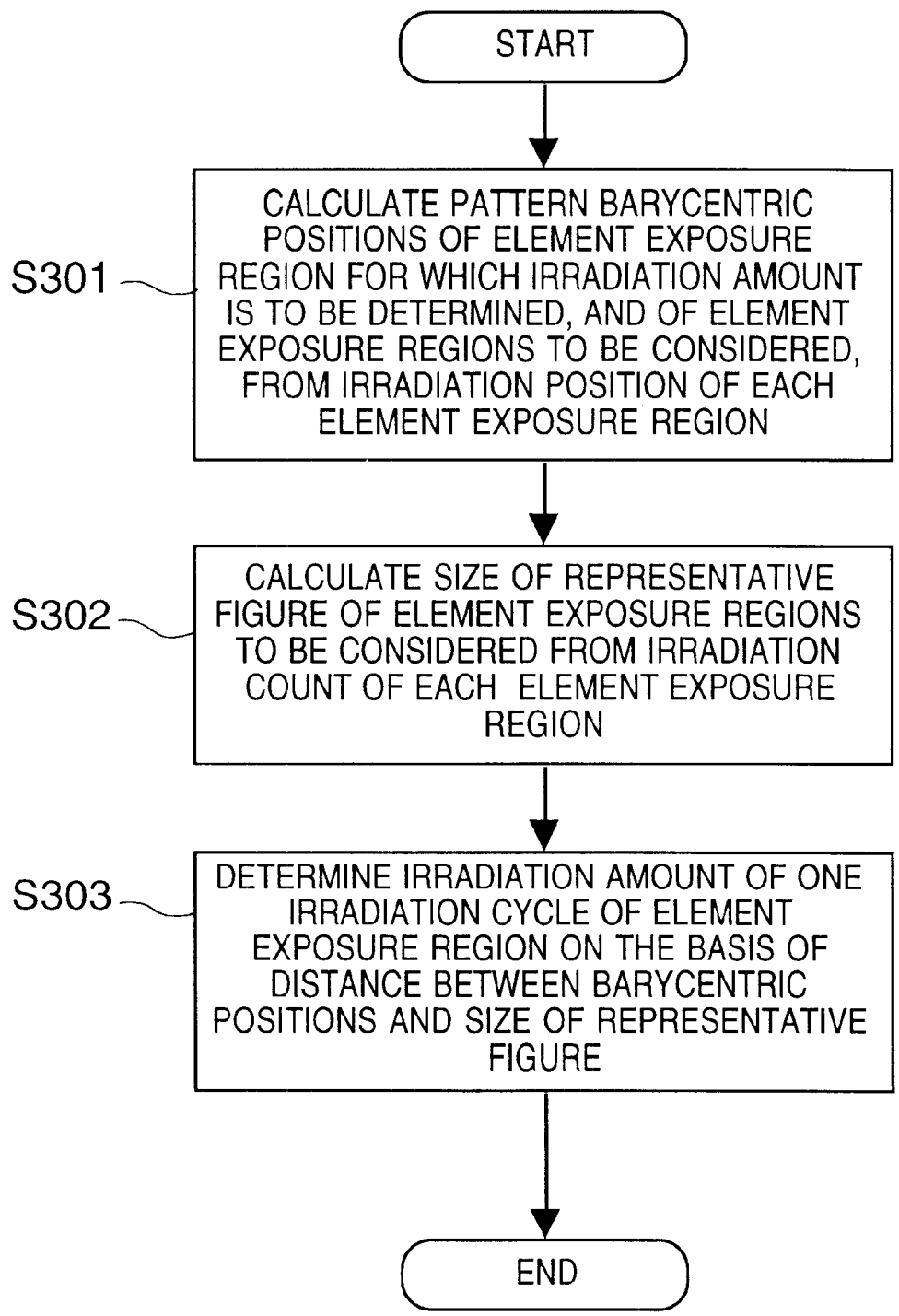
FIG. 10 is a flow chart for explaining correction processing.

An example of the correction method employing the representative figure scheme will be described. In step S113, regarding the selected element exposure region, the CPU 25 performs a processing operation as shown in FIG. 10.

(Step S301)

As shown in FIG. 11, element exposure regions about the element exposure region EF(0), for which the irradiation amount is to be determined, as the center, the diameter of which is included in a circle having a diameter about 3 times the backscattering diameter σb of the electron beam on the wafer, are selected as the element exposure regions to be considered, in the same manner as with the area density mapping scheme. The average position of the plurality of electron beam irradiation positions of the element exposure region EF(i) obtained in advance is calculated, and this average position is defined as the barycentric position (Xi, Yi) of the pattern to be drawn in the element exposure region EF (i).

(Step S302)

The size of the representative figure to be drawn in the respective element exposure regions is calculated from the electron beam irradiation count Ni of the element exposure region EF (i) obtained in advance:

$$Ai=\sqrt{Ni}$$

(Step S303)

On the basis of the calculated barycentric positions of the respective element exposure regions and size of the representative figure, or more comprehensively, on the basis of the pattern of a predetermined region including the element exposure region for which the irradiation amount is to be determined, an irradiation time t of one irradiation cycle (corresponding to the irradiation amount of one irradiation cycle) of the element exposure region, for which the irradiation amount is to be determined, is calculated by using the following equation:

$$t=ts\times(1-\eta\Sigma)[erf\{(Xi-X0+Ai)/\sigma b\}-erf\{(Xi-X0+Ai)/\sigma b\}\times erf\{(Yi-Y0+Ai)/\sigma b\}-erf\{(Yi-Y0+Ai)/\sigma b\}]$$

where η is the backscattering coefficient and ts is the preset standard irradiation time of one irradiation cycle. Also, "erf" is a function as follows:

$$erf(P)=\frac{1}{2}\sqrt{\pi}\int\epsilon^{-u^2}du$$

<Description of Exposure on the Basis of Exposure Control Data>

Figure 12:
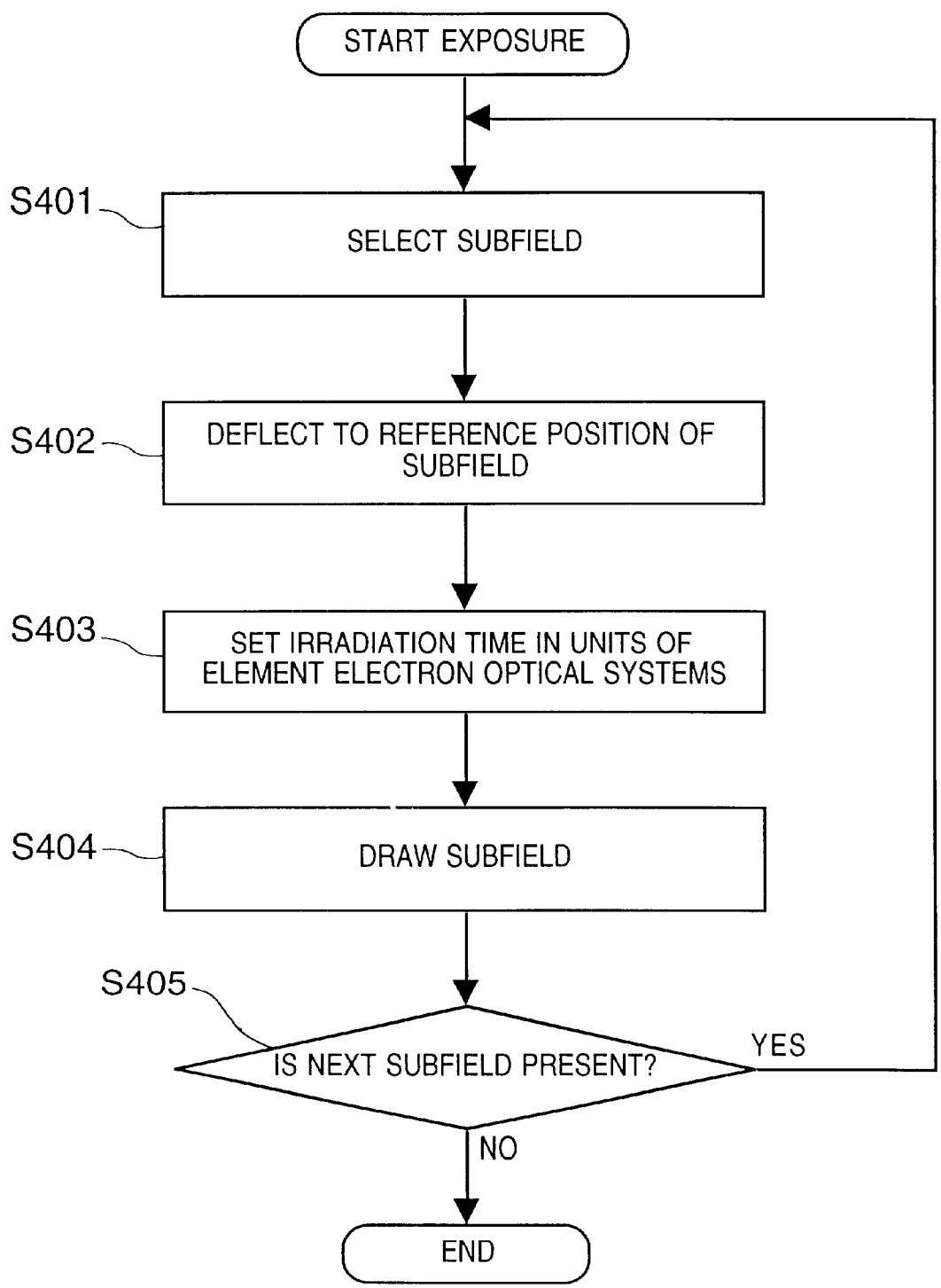
FIG. 12 is a flow chart for explaining exposure based on exposure control data.

After instructing the control system 22 through the interface 24 to perform exposure, the CPU 25 performs the steps as shown in FIG. 12 on the basis of the transferred exposure control data on the memory 23. These steps will be described.

(Step S401)

A subfield to be exposed is selected.

(Step S402)

The control system 22 instructs the drawing deflector control circuit 17 to deflect the plurality of electron beams by the main deflector 61, so that the respective electron beams from the plurality of element electron optical systems are located at the reference positions of the subfields to be exposed.

(Step S403)

The blanking-off times of the element electron optical systems corresponding to the respective element exposure regions are set in the blanking control circuit 14 so as to be equal to the electron beam irradiation time of one irradiation cycle determined in units of element exposure regions.

(Step S404)

The control system 22 instructs the drawing deflector control circuit 17 to deflect the plurality of electron beams from the element electron optical system array 3 by the subdeflector 62 to deflection positions determined by the exposure control data with the preset minimum deflection width as a unit. Simultaneously, the control system 22 instructs the blanking control circuit 14 to turn on/off the blanking electrodes of the respective element electron optical systems with the blanking-off time preset in accordance with the pattern to be exposed on the wafer 5, thereby drawing the subfield. At this time, the X-Y stage 12 continuously moves in the X direction, and the drawing deflector control circuit 17 controls the deflection positions of the electron beams including the moving amount of the X-Y stage 12.

(Step S405)

If a subfield to be exposed next is present, the flow returns to the step S401. If not, exposure is ended.

<Description of Device Production Method>

Figure 13:
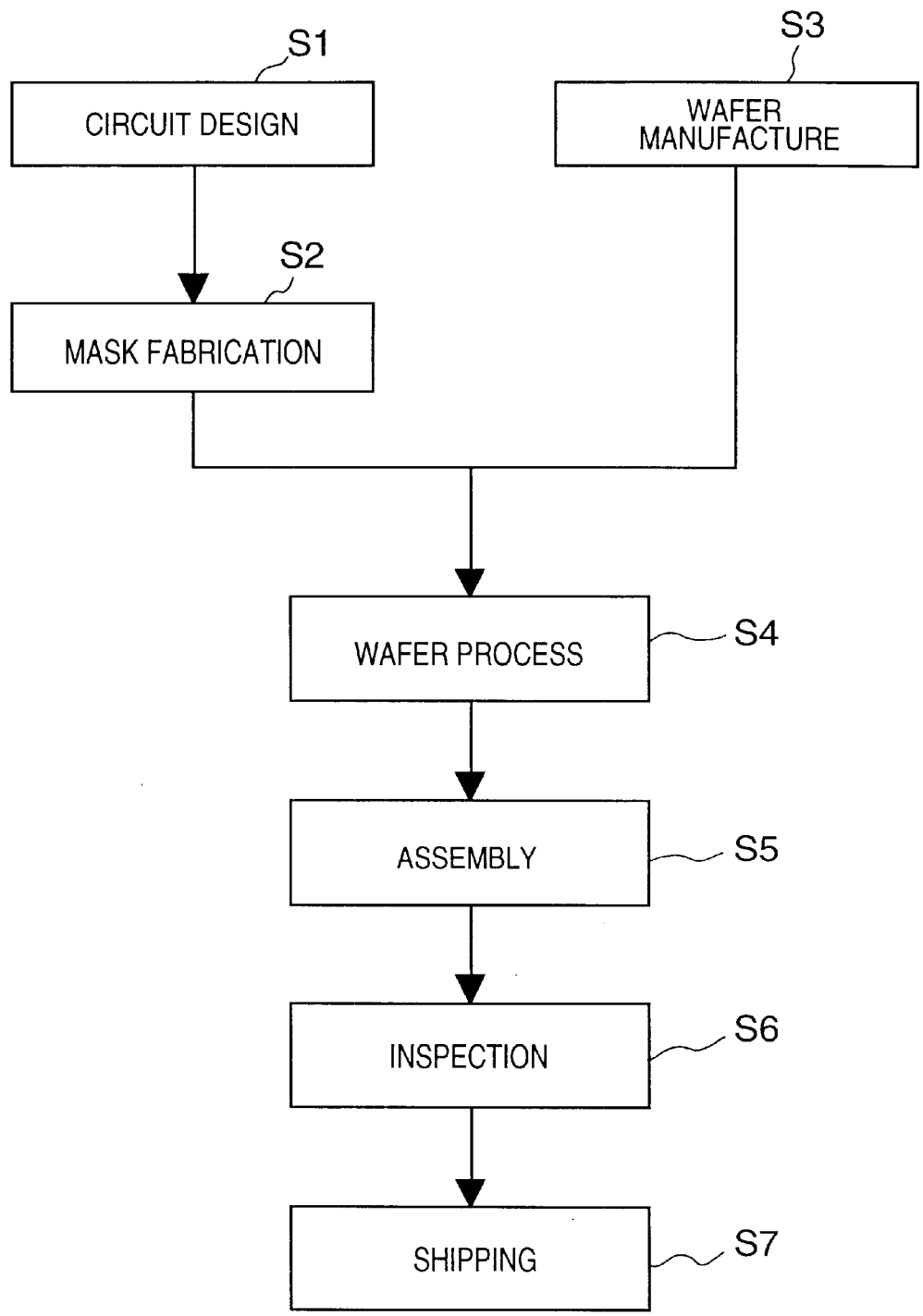
FIG. 13 is a flow chart for explaining small device manufacturing flow.
Figure 15A:
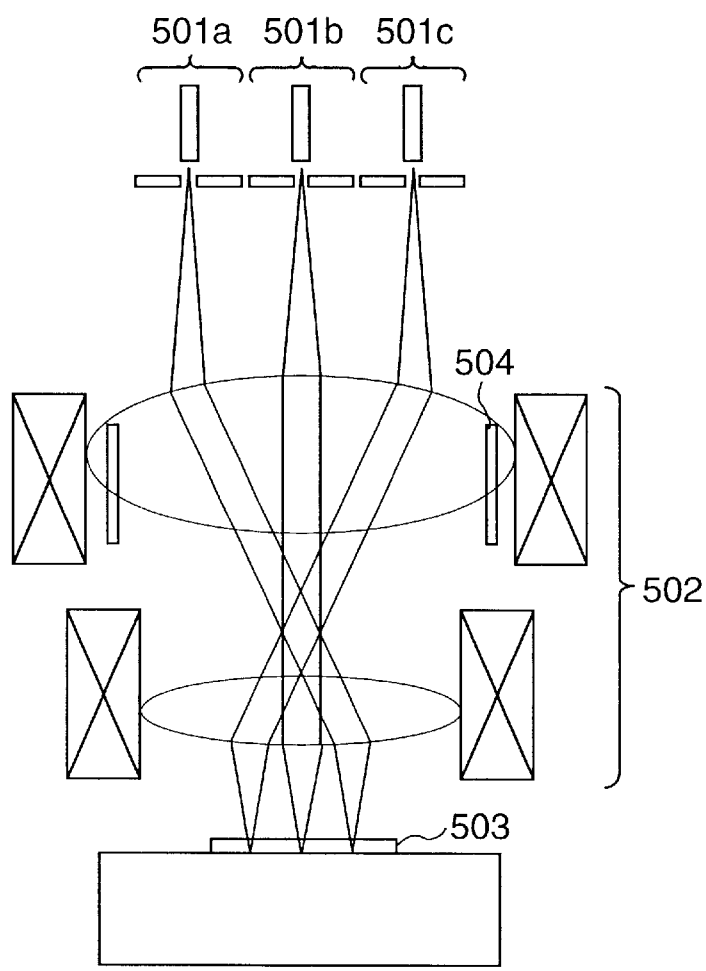
FIGS. 15A to 15D are views for explaining a conventional multi electron beam exposure apparatus.
Figure 15B:
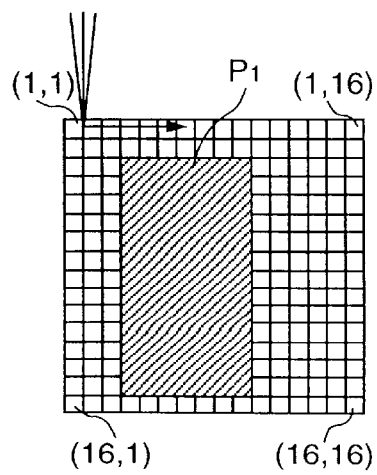
Figure 15C:
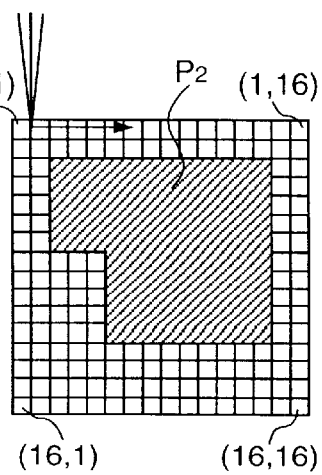
Figure 15D:
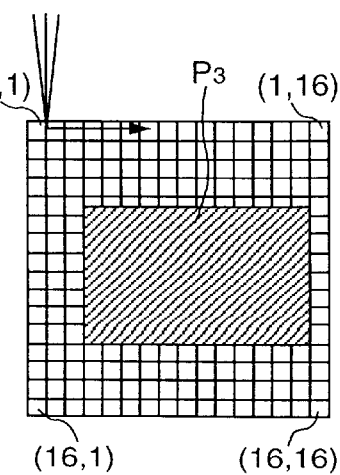

An embodiment of a device production method utilizing the electron beam exposure apparatus described above will be described. FIG. 13 shows the flow chart of the manufacture of a microdevice (a semiconductor chip such as an IC or LSI, a liquid crystal panel, a CCD, a thin film magnetic head, a micromachine, or the like). In step 1 (circuit design), the circuit of the semiconductor device is designed. Instep 2 (formation of exposure control data), the exposure control data of the exposure apparatus is formed on the basis of the designed circuit pattern. In step 3 (wafer manufacture), a wafer is manufactured by using a material such as silicon. Step 4 (wafer process) is called a pre-process. An actual circuit is formed on the wafer in accordance with lithography by using the exposure apparatus, to which the prepared exposure control data described above has been input, and the wafer. Next step 5 (assembly) is called a post-process. The wafer fabricated in step 4 is formed into semiconductor chips. Step 5 includes steps such as an assembly step (dicing and bonding) and a packaging step (chip encapsulation). In step 6 (inspection), the semiconductor device fabricated in step 5 is inspected by operation confirmation test, durability test, and the like. The semiconductor device is completed through these steps, and is shipped (step 7).

FIG. 14 shows the flow chart of this wafer process in detail. In step 11 (oxidation), the surface of the wafer is oxidized. In step 12 (CVD), an insulating film is formed on the surface of the wafer. In step 13 (electrode formation), electrodes are formed on the wafer by vapor deposition. In step 14 (ion implantation), ions are implanted in the wafer. In step 15 (resist process), a photosensitive agent is applied to the wafer. In step 16 (exposure), the circuit pattern is baked and exposed onto the wafer with the exposure apparatus described above. In step 17 (development), the exposed wafer is developed. In step 18 (etching), a portion other than the developed resist image is removed. In step 19 (resist separation), the resist no longer necessary after etching is removed. These steps are repeatedly performed to form multiplex circuit patterns on the wafer.

When the manufacturing method of this embodiment is used, a semiconductor device having a high packing density, which is conventionally difficult to manufacture, can be manufactured at a low cost.

As has been described above, according to the preferable embodiment of the present invention, an increase in exposure control data can be reduced by, e.g., setting the element exposure regions of the respective electron beams and regions employed for reducing the proximity effect to coincide with each other. In the element exposure regions, since the electron beam irradiation time of one irradiation cycle is constant, the load on the control system that controls the irradiation time can be reduced.

The present invention is not limited to the above embodiment and various changes and modifications can be made within the spirit and scope of the present invention. Therefore, to apprise the public of the scope of the present invention the following claims are made.

What is claimed is:

1. An electron beam exposure method of drawing a plurality of partial patterns on a plurality of element regions on a substrate with a plurality of electron beams, wherein each of the plurality of element regions is scanned with a corresponding one of the plurality of electron beams, thereby drawing a pattern constituted by the plurality of partial patterns on the substrate, said method comprising:

a determination step of determining, for each of the plurality of element regions, an electron beam irradiation amount that is common for irradiation positions within a corresponding one of the plurality of element regions so as to reduce an influence of a proximity effect upon the element region when an associated region, including the element region and regions close to the element region, is irradiated with the electron beam; and a drawing step of drawing the partial patterns on the plurality of element regions on the substrate with the plurality of electron beams while controlling the plurality of electron beams to have the electron beam irradiation amounts determined in said determination step.

2. The method according to claim 1, wherein the plurality of element regions are aligned with an array pitch not more than a backscattering diameter of the plurality of electron beams.

3. The method according to claim 1, wherein the plurality of electron beams are aligned on the substrate with a gap not more than a backscattering diameter of the plurality of electron beams.

4. The method according to claim 1, wherein the determination step comprises determining, for each element region, the electron beam irradiation amount by considering a count with which the electron beams irradiate the associated region.

5. The method according to claim 1, wherein the determination step comprises determining, for each element region, the electron beam irradiation amount by considering an area density of the pattern to be drawn within the associated region.

6. The method according to claim 1, wherein the determination step comprises determining, for each element region, the electron beam irradiation amount by considering a barycentric position of the pattern to be drawn within the associated region.

7. The method according to claim 1, wherein the determination step comprises determining, for each element region, the electron beam irradiation amount by considering a position to be irradiated with the electron beams within the associated region.

8. The method according to claim 1, further comprising:

an acquisition step of acquiring the pattern to be drawn on the substrate; and a division step of dividing the pattern acquired in the acquisition step into units of element regions, wherein the determination step comprises determining the electron beam irradiation amounts on the basis of the pattern divided in the division step.

9. A method of constructing exposure control data for controlling a process of drawing a pattern constituted by a plurality of partial patterns on a substrate by drawing the plurality of partial patterns on a plurality of element regions on the substrate, wherein each of the plurality of element regions is scanned with a corresponding one of the plurality of electron beams, said method comprising:

an acquisition step of acquiring the pattern to be drawn onto the substrate;

a division step of dividing the pattern acquired in the acquisition step into units of element regions;

a determination step of determining, for each of the plurality of element regions, an electron beam irradiation amount that is common for irradiation positions within a corresponding one of the plurality of element regions so as to reduce an influence of a proximity effect upon the element region when an associated region, including the element region and regions close to the element region, is irradiated with the electron beams; and a construction step of constructing the exposure control data on the basis of a determination result of the determination step and recording the exposure control data on a memory medium.

10. The method according to claim 9, wherein the plurality of element regions are aligned with an array pitch not more than a backscattering diameter of the plurality of electron beams.

11. The method according to claim 9, wherein the plurality of electron beams are aligned on the substrate with a gap not more than a backscattering diameter of the plurality of electron beams.

12. The method according to claim 9, wherein the determination step comprises determining, for each element region, the electron beam irradiation amount by considering a count with which the electron beams irradiate the associated region.

13. The method according to claim 9, wherein the determination step comprises determining, for each element region, the electron beam irradiation amount by considering an area density of the pattern to be drawn within the associated region.

14. The method according to claim 9, wherein the determination step comprises determining, for each element region, the electron beam irradiation amount by considering a barycentric position of the pattern to be drawn within the associated region.

15. The method according to claim 9, wherein the determination step comprises determining, for each element region, the electron beam irradiation amount by considering a position to be irradiated with the electron beam within the associated region.

16. The method according to claim 9, wherein the determination step further comprises determining the electron beam irradiation amounts on the basis of the pattern divided in the division step.

17. A computer-readable program, for constructing exposure control data for controlling a process of drawing a pattern constituted by a plurality of partial patterns on a substrate by drawing the plurality of partial patterns on a plurality of element regions on the substrate, wherein each of the plurality of element regions is scanned with a corresponding one of the plurality of electron beams, said program comprising:

an acquisition step of acquiring the pattern to be drawn onto the substrate;

a division step of dividing the pattern acquired in the acquisition step into units of element regions;

a determination step of determining, for each of the plurality of element regions, an electron beam irradiation amount that is common for irradiation positions within a corresponding one of the plurality of element regions so as to reduce an influence of a proximity effect upon the element region when an associated region, including the element region and regions close to the element region, is irradiated with the electron beams; and a construction step of constructing the exposure control data on the basis of a determination result of the determination step and recording the exposure control data on a memory medium.

18. An electron beam exposure control apparatus for drawing a plurality of partial patterns on a plurality of element regions, wherein each of the plurality of element regions is scanned with a corresponding one of the plurality of electron beams, thereby drawing a pattern constituted by the plurality of partial patterns on the substrate, said apparatus comprising:

a computer arranged to determine, for each of the plurality of element regions, an electron beam irradiation amount that is common for irradiation positions within a corresponding one of the plurality of element regions so as to reduce an influence of a proximity effect upon the element region when an associated region, including the element region and regions close to the element region, is irradiated with the electron beams.

19. The apparatus according to claim 18, wherein the plurality of element regions are aligned with an array pitch not more than a backscattering diameter of the plurality of electron beams.

20. The apparatus according to claim 18, wherein the plurality of electron beams are aligned on the substrate with a gap not more than a backscattering diameter of the plurality of electron beams.

21. The apparatus according to claim 18, wherein said computer is further arranged to determine, for each element region, the electron beam irradiation amount by considering a count with which the electron beams irradiate the associated region.

22. The apparatus according to claim 18, wherein said computer is further arranged to determine, for each element region, the electron beam irradiation amount by considering an area density of the pattern to be drawn within the associated region.

23. The apparatus according to claim 18, wherein said computer is further arranged to determine, for each element region, the electron beam irradiation amount by considering a barycentric position of the pattern to be drawn within the associated region.

24. The apparatus according to claim 18, wherein said computer is further arranged to determine, for each element region, the electron beam irradiation amount by considering a position to be irradiated with the electron beams within the associated region.

25. The apparatus according to claim 18, wherein said computer is further arranged:

to acquire the pattern to be drawn on the substrate;

to divide the acquired pattern into units of element exposure regions, and to determine the electron beam irradiation amounts on the basis of the divided pattern.

26. A device manufacturing method comprising:

drawing a pattern on a substrate in accordance with said electron beam exposure method according to claim 1; and developing the substrate on which the pattern is drawn.

27. A device manufacturing method comprising:

drawing a pattern on a substrate while controlling an electron beam exposure apparatus in accordance with exposure control data constructed by said constructing method according to claim 9; and developing the substrate on which the pattern is drawn.

* * * * *

UNITED STATES PATENT AND TRADEMARK OFFICE
CERTIFICATE OF CORRECTION

PATENT NO.    : 6,657,210 B1
DATED         : December 2, 2003
INVENTOR(S)   : Masato Muraki It is certified that error appears in the above-identified patent and that said Letters Patent is hereby corrected as shown below:

Drawings,
Sheet 8, Fig. 8, the legend above the second table, "UNTIS" should read -- UNITS --.

Column 2,
Line 59, "beam" should read -- beams --.

Column 4,
Line 66, "comes incident" should read -- comes to be incident --.

Column 9,
Line 52, "continues" should read -- continuous --.
Line 65, "(MF1, FM2," should read -- (MF1, MF2, --.

Column 10,
Line 10, "come incident" should read -- is incident --.

Column 11,
Line 19, the right margin should be closed-up after "art."
Before line 20, the following paragraph should be inserted:
    -- <Description of Method Determining Irradiation Amount For
    Reducing Proximity Effect> --.

Column 12,
Line 47, "thepreset" should read -- the preset --.

Column 13,
Line 32, "Instep 2" should read -- In step 2 --.

Signed and Sealed this

Twenty-fifth Day of May, 2004

JON W. DUDAS
*Acting Director of the United States Patent and Trademark Office*